US008564986B2

(12) United States Patent
Wing et al.

(10) Patent No.: US 8,564,986 B2
(45) Date of Patent: Oct. 22, 2013

(54) REGULATED OUTPUT CURRENT AND SLOPE CONTROL

(76) Inventors: Kenneth E. Wing, Alpine, CA (US); Scott T. Carroll, Lakeside, CA (US)

( * ) Notice: Subject to any disclaimer, the term of this patent is extended or adjusted under 35 U.S.C. 154(b) by 497 days.

(21) Appl. No.: 12/526,034

(22) PCT Filed: Feb. 6, 2008

(86) PCT No.: PCT/US2008/053231
§ 371 (c)(1),
(2), (4) Date: Aug. 5, 2009

(87) PCT Pub. No.: WO2008/098091
PCT Pub. Date: Aug. 14, 2008

(65) Prior Publication Data
US 2010/0321967 A1    Dec. 23, 2010

Related U.S. Application Data

(60) Provisional application No. 60/899,783, filed on Feb. 6, 2007.

(51) Int. Cl.
*H02M 7/10*    (2006.01)

(52) U.S. Cl.
USPC .............................. 363/61; 363/126

(58) Field of Classification Search
USPC .............. 363/59, 60, 61, 81, 84, 89, 125, 126
See application file for complete search history.

(56) References Cited

U.S. PATENT DOCUMENTS

| 3,668,463 | A | * | 6/1972 | Smith et al. | 315/370 |
| 3,869,659 | A | * | 3/1975 | Doong et al. | 363/60 |
| 4,028,596 | A | * | 6/1977 | Weber | 361/235 |
| 4,167,777 | A | * | 9/1979 | Allington | 363/61 |
| 4,623,824 | A | * | 11/1986 | Scolari et al. | 315/241 R |
| 4,745,520 | A | * | 5/1988 | Hughey | 361/228 |
| 4,893,227 | A | * | 1/1990 | Gallios et al. | 363/26 |
| 5,282,122 | A | * | 1/1994 | Summer | 363/21.15 |
| 5,331,255 | A | * | 7/1994 | Banbury et al. | 315/411 |
| 5,847,945 | A | * | 12/1998 | Burtin et al. | 363/60 |

* cited by examiner

*Primary Examiner* — Gary L Laxton

(57) ABSTRACT

A current mode output control can have a current mode (CM) region of the high voltage output curve (VI) slope controlled by component selection and arrangement in the construction of high voltage power supplies. The controlled CM current slope output, the tapped multiplier feedback network, and the subsequent output voltage correction network, yields a power supply with the desired VM and CM output characteristics that is significantly less expensive to construct and more efficient than a power supply built using conventional construction techniques.

10 Claims, 6 Drawing Sheets

REGULATED OUTPUT CURRENT AND SLOPE CONTROL

This patent application claims the benefit of U.S. provisional patent application Ser. No. 60/899,783 filed on Feb. 6, 2007.

FIELD OF THE INVENTION

The present invention relates to a method of regulating of the output current of high voltage power supplies, and more particularly relates to and includes slope control of the output current as voltage mode regulation shifts to current mode regulation.

BACKGROUND OF THE INVENTION

A High Voltage Power Supply's output (HVPS or hereinafter referred to as just a "power supply") is typically output voltage regulated, so that the output voltage remains relatively stable over a wide range of output currents that varying the load may present to the unit. This is called Voltage Mode (VM) regulation. Additionally, the output current of the power supply may be limited to some maximum current while still in the VM region, either for the protection of the power supply itself or the load, or both. Once the threshold of VM has been passed, the power supply then would go into Current Mode (CM) region of control, where a decrease in load resistance does not cause an increase in current output, but rather causes a decrease of voltage output, while holding the output current constant. Therefore, in some applications, it would be highly desirable to have a circuit displaying more slope, that is, less steep slope in the CM region of the power supply curve.

At times, it is necessary to have the CM slope something other than near vertical. The current application approaches this problem with two novel solutions; both aimed at maintaining highest efficiency, and lowest cost.

In this respect, before explaining at least one embodiment of the invention in detail it is to be understood that the invention is not limited in its application to the details of construction and to the arrangement of the components set forth in the following description or illustrated in the drawings. The invention is capable of other embodiments and of being practiced and carried out in various ways. In addition, it is to be understood that the phraseology and terminology employed herein are for the purpose of description and should not be regarded as limiting.

SUMMARY OF THE INVENTION

The principle object of this invention is to provide an output slope that is less steep than vertical in the CM region. The output voltage drop is remedied by utilizing the current feedback voltage signal to create a correction voltage fed to the voltage feedback signal. The current feedback signal may be reduced, in the range of a volt or more, with a resistive voltage divider network and adding the correction voltage to the reference voltage. An inverting amplifier device, such an inverting op amp stage, may need to be employed if the correction signal is of the opposite polarity needed.

The preferred embodiment of the invention involves the use of Current Mode (CM) output control with CM region of the high voltage output VI curve slope controlled by innovative component selection. A novel technique is employed here to bring the power back in line with the desired lower value. Instead of sensing the output voltage from the end of the third multiplier stage, the output voltage can be sensed at the output of an earlier stage in the multiplier. Remedying the output voltage drop, in the VM region due to the inherent voltage drop of the successive multiplier stages, is done by utilizing the current feedback voltage signal to create a correction voltage. The current feedback signal, which may be in the range of a volt or more, is reduced with a resistive voltage divider network, and the correction voltage is added to the reference voltage of the VM amplifier. An inverting amplifier device, such an inverting op amp stage, may need to be employed if the correction signal is of the opposite polarity needed. In this way, the power supply curve is optimally flat in the VM region.

It must be clearly understood at this time although the preferred embodiment of the invention consists of the use of Current Mode (CM) output control with CM region of the high voltage output VI curve slope controlled by innovative component selection, including any number of high voltage circuits requiring a safe and efficient high voltage delivery to numerous configurations of contacts, or other combinations thereof, that need to achieve a similar operation, will also be fully covered within the scope of this patent.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention. Therefore, the foregoing is considered as illustrative only of the principles of the invention.

Further, since numerous modifications and changes will readily occur to those skilled in the art, it is not desired to limit the invention to the exact construction and operation shown and described, and accordingly, all suitable modifications and equivalents may be resorted to, falling within the scope of the invention.

BRIEF DESCRIPTION OF THE DRAWINGS

The accompanying drawings, which are incorporated in and form a part of this specification, illustrate embodiments of the invention and together with the description, serve to explain the principles of this invention.

Figure 1:
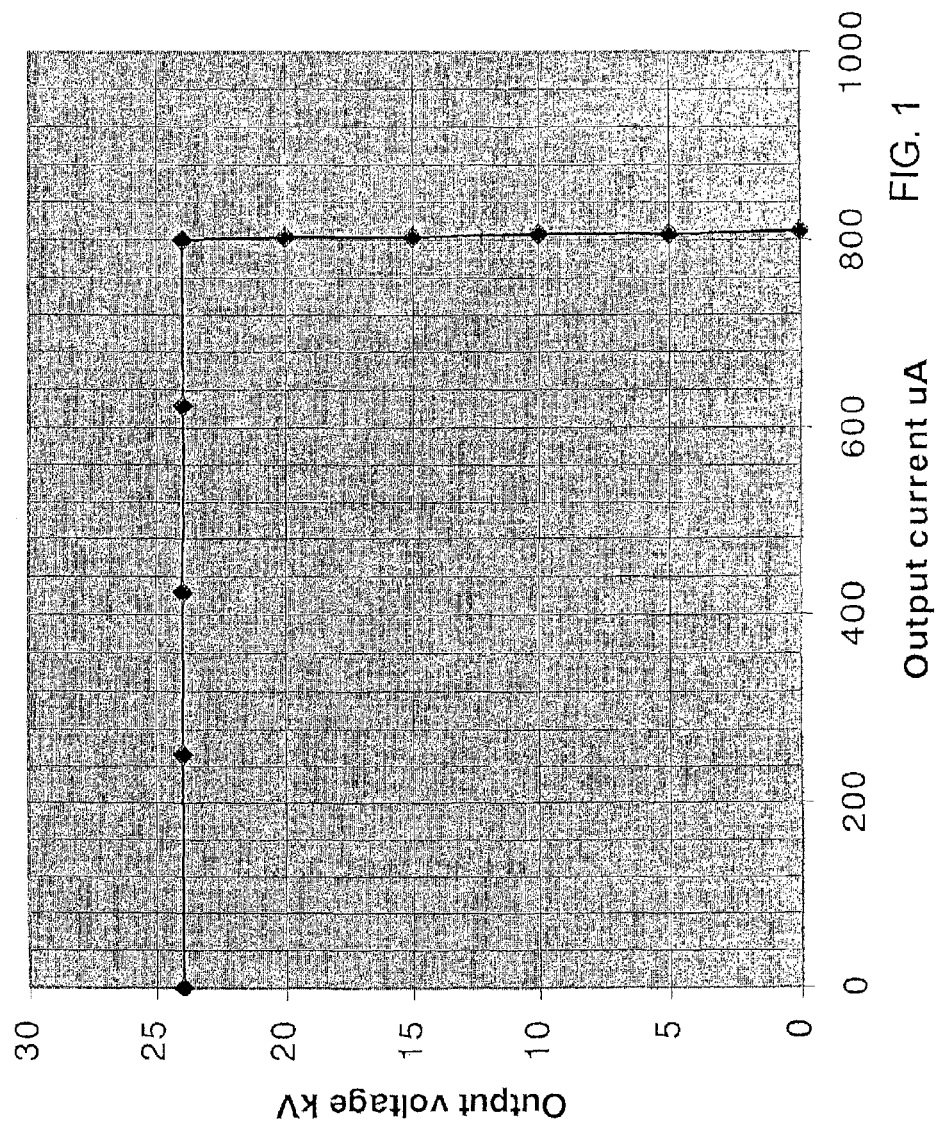
FIG. 1 depicts a typical prior art power supply VI curve.

For a fuller understanding of the nature and objects of the invention, reference should be had to the following detailed description taken in conjunction with the accompanying drawings which are incorporated in and form a part of this specification, illustrate embodiments of the invention and together with the description, serve to explain the principles of this invention.

DETAILED DESCRIPTION OF THE PREFERRED EMBODIMENTS

For a fuller understanding of the nature and objects of the invention, reference should be had to the following detailed description taken in conjunction with the accompanying drawings wherein similar parts of the invention are identified by like reference numerals.

Use of Current Mode (CM) Output Control with CM Region of the High Voltage Output VI Curve Slope Controlled by Innovative Component Selection.

A High Voltage Power Supply's output (HVPS or just "power supply") is typically output voltage regulated, so that the output voltage remains relatively stable over a wide range of output currents that varying the load may present to the unit. This is called Voltage Mode (VM) regulation. Additionally, the output current of the power supply may be limited to some maximum current while still in the VM region, either for the protection of the power supply itself or the load, or both. Once the threshold of VM has been passed, the power supply then would go into Current Mode (CM) region of control, where a decrease in load resistance does not cause an increase in current output, but rather causes a decrease of voltage output, while holding the current constant.

A Voltage vs. Current plot (called a VI plot for the typical voltage and current symbols used) for a typical voltage and current controlled power supply looks like that of FIG. 1 FIG. 1 depicts a typical prior art power supply VI curve. As one can see, once an output current of 800 is reached, the power supply switches from VM or constant voltage mode, to CM, or constant current mode.

Figure 2:
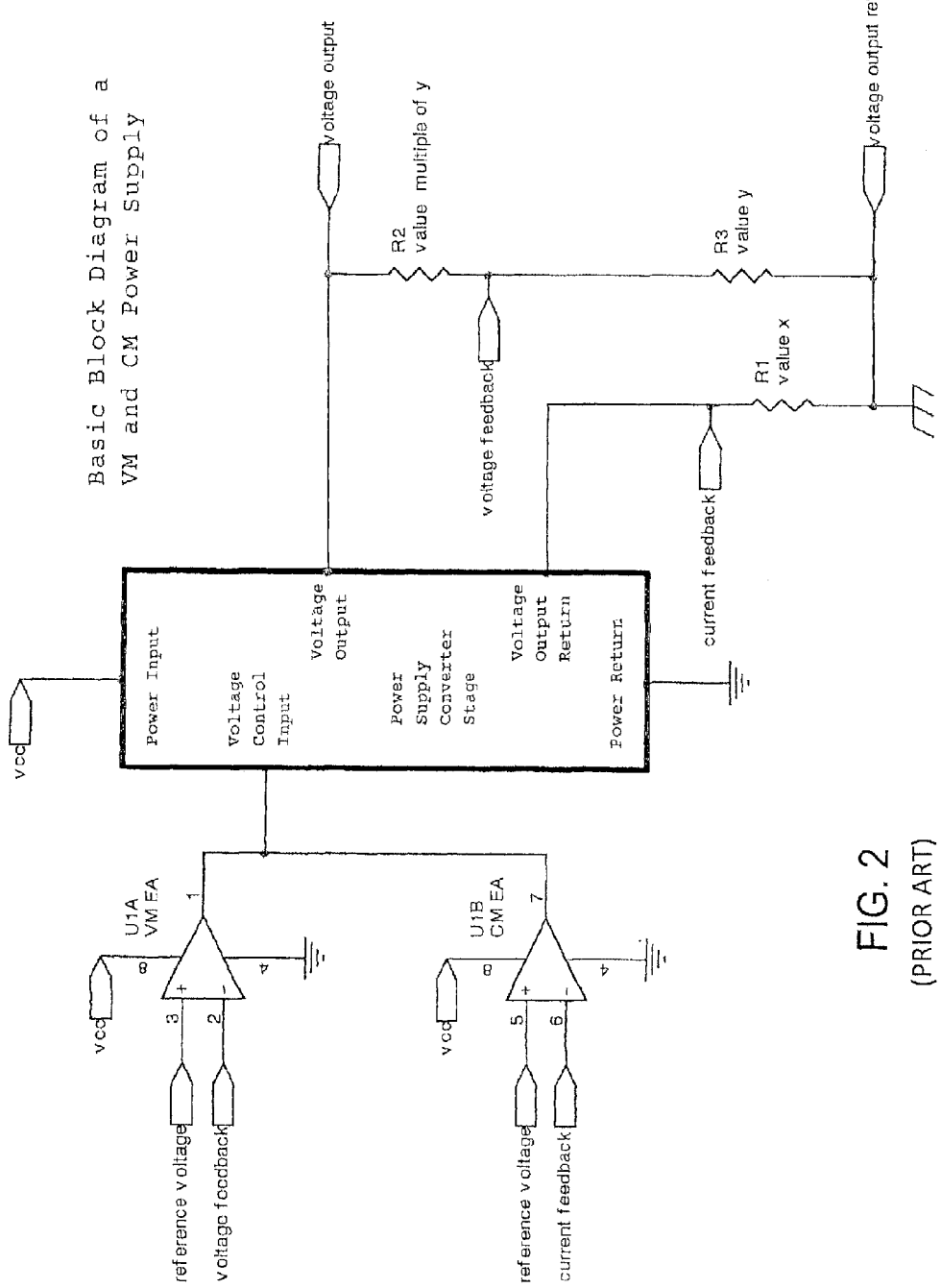
FIG. 2 depicts a block diagram of a typical VM and CM power supply.

Referring now to FIG. 2, here is illustrated a block diagram of a typical VM and CM power supply. The VM performance is typically obtained by the use of a control element called a VM Error Amplifier, which is typically comprised of an operational amplifier, or op amp, with an inverting input, a non-inverting input, and an output. The inverting input of the op amp receives a signal representative of the actual output voltage, through a resistive "feedback" network. The non-inverting input of the amplifier receives a "reference" or fixed voltage, which the op amp will compare to the feedback voltage. The output of the amplifier will seek a level that will cause the power supply's output voltage to provide a feedback voltage that is equal to the reference voltage, and thus the power supply's output voltage is actively managed to stay constant. The output voltage will stay constant as long as the VM Error Amplifier (EA) is in its active region.

Upon reaching a certain or "programmed" output current threshold, another error amplifier "takes over" control of the power supply output voltage. This constant current mode is controlled by another amplifier, the CM EA. Output current feedback is obtained by another sensor, generating a feedback voltage proportional to the output current returned to the power supply through the sense resistor. This current feedback signal is applied to the inverting input of the CM EA, and again a reference voltage is applied to the non-inverting input of the op amp. The output of the CM EA is used to control the power supply's output such that the two inputs are equalized, and thus causing the output of the power supply to stay at a constant current level past the programmed threshold point.

Referring back to FIG. 1 above, one can see a slight "slope" to the output curve while in the CM region. This is due to the fact that not all of the output current of the power supply is delivered to the load. By necessity, a small sampling of the output current is required in order to generate the voltage feedback signal. This "waste" current is conducted through the resistors R2 and R3 in the circuit of FIG. 2. The slope of the line is directly related to the voltage impressed upon the series combination of the two resistors. At maximum output voltage, the output current represented is approximately 800 uA in this example. At minimum output voltage, the current is shown at approximately 808 uA. This 8 uA of current through the two series resistors is thus subtracting from the output current available at full voltage, but since no current will flow through the resistors at zero voltage across them, the full output current of 808 uA is delivered to the load. The slope of the CM line is related by Ohm's Law, which results in 24 kV/8 uA equaling 3 Giga Ohms. So, the combination of R2 and R3 in series for this example is 3 Giga Ohms.

At times, it is necessary to have the CM slope something other than near vertical. The present application approaches this problem with two novel solutions; both aimed at maintaining highest efficiency, and lowest cost.

To explain this, the actual output circuit of the high voltage power supply must be examined. The typical high voltage power supply uses an output rectifier made up of voltage multiplying rectifier stages. For example, the lowest cost multiplying rectifier stage is a half wave implementation of the Cockcroft—Walton voltage doubler. For increased voltage, multiple stages can be employed in series (for this example three), as shown by FIG. 3.

Figure 3:
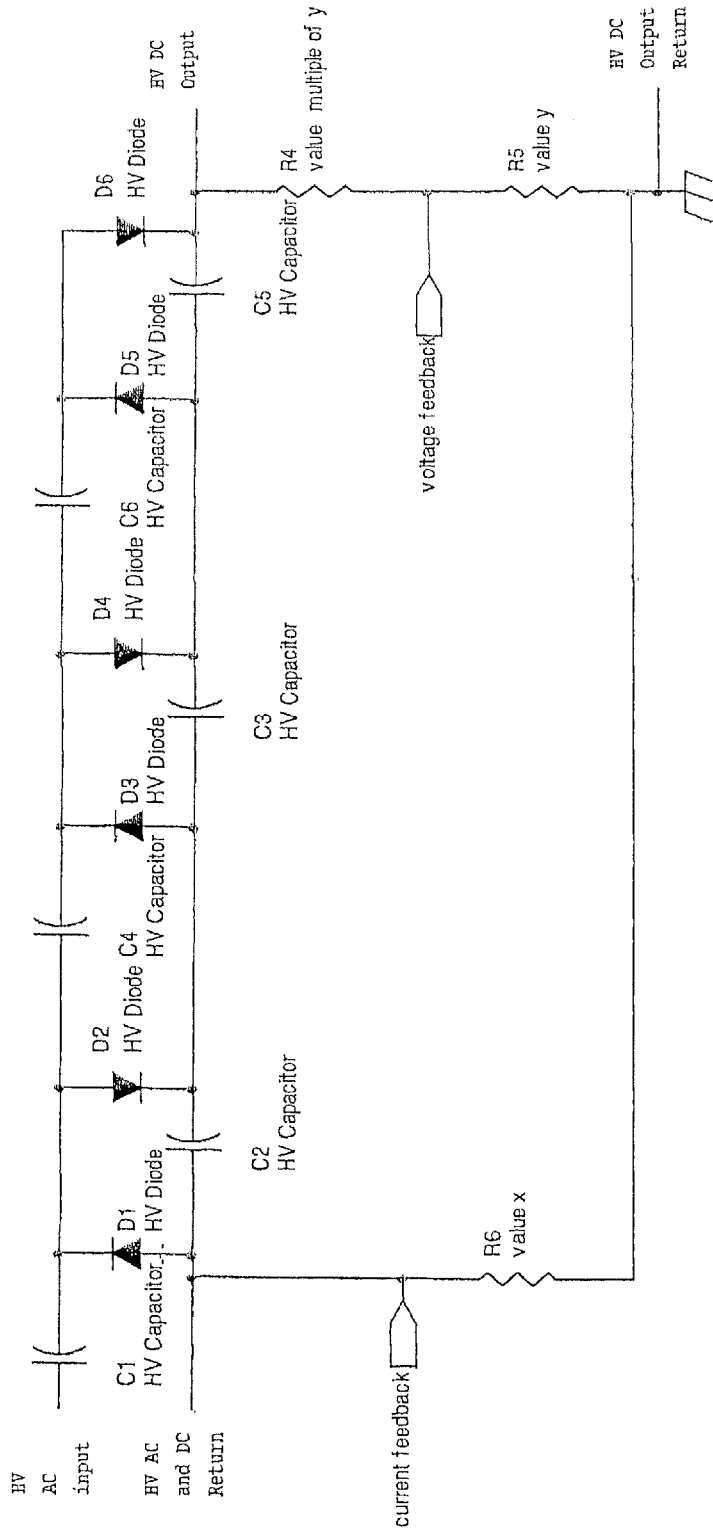
FIG. 3 depicts a typical multi-stage half-wave high voltage multiplying rectifier with feedback sensor elements.

FIG. 3 depicts a typical multi-stage high voltage rectifier with feedback sensor elements. Again, the current and voltage feedback signals, necessary for regulation of the power supply's output voltage, are implemented by resistive elements. The power lost by the "waste" current in the voltage feedback divider elements, again by Ohm's Law ($P=V \times I$), is the full output voltage multiplied by the total resistance of the two resistors in series. For the example of 24 kV and 8 uA, this would be 192 mW. Again, for this example, the slope of the VI curve in the constant current or CM region of the VI curve is nearly vertical.

To provide an output slope that is less steep in the CM region, a simple technique is employed—reduce the resistance of the output voltage divider. If a slope that is 6 times less steep is desired, or for this example, 48 uA from maximum to minimum voltage, the total resistance of the divider must be reduced by a factor of 6, thus to 500 Mega Ohms. Doing so will produce an output curve like that of FIG. 4.

Figure 4:
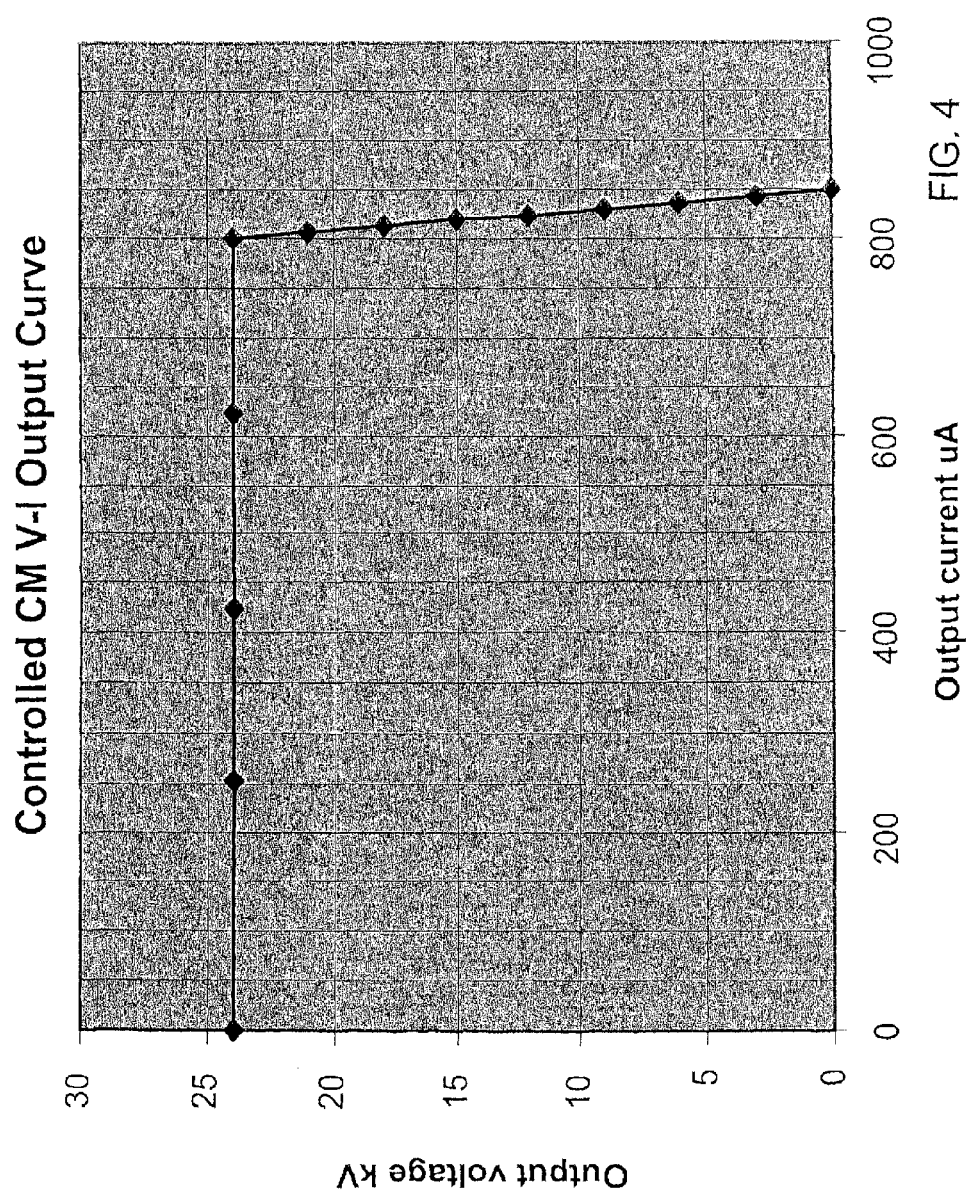
FIG. 4 depicts a VI curve with more slope in the CM region.

FIG. 4 depicts a voltage versus current or VI curve with more slope in the CM region. This illustrates the controlled CM V-I output curve. However, a problem occurs when this is done. The 500M Ohm resistance consumes more power, reducing efficiency of the power supply. With this new lower resistance, the power consumed by the voltage feedback divider becomes 1.152 watts; 6 times that of the original.

A novel technique is employed here to bring the power back in line with the desired lower value. Instead of sensing the output voltage from the end of the third multiplier stage, the output voltage at the output of an earlier stage in the multiplier is sensed. In this example of FIG. 5, the first stage is used (see FIG. 5, the HV Multiplier with Earlier Voltage Sensing Divider).

Figure 5:
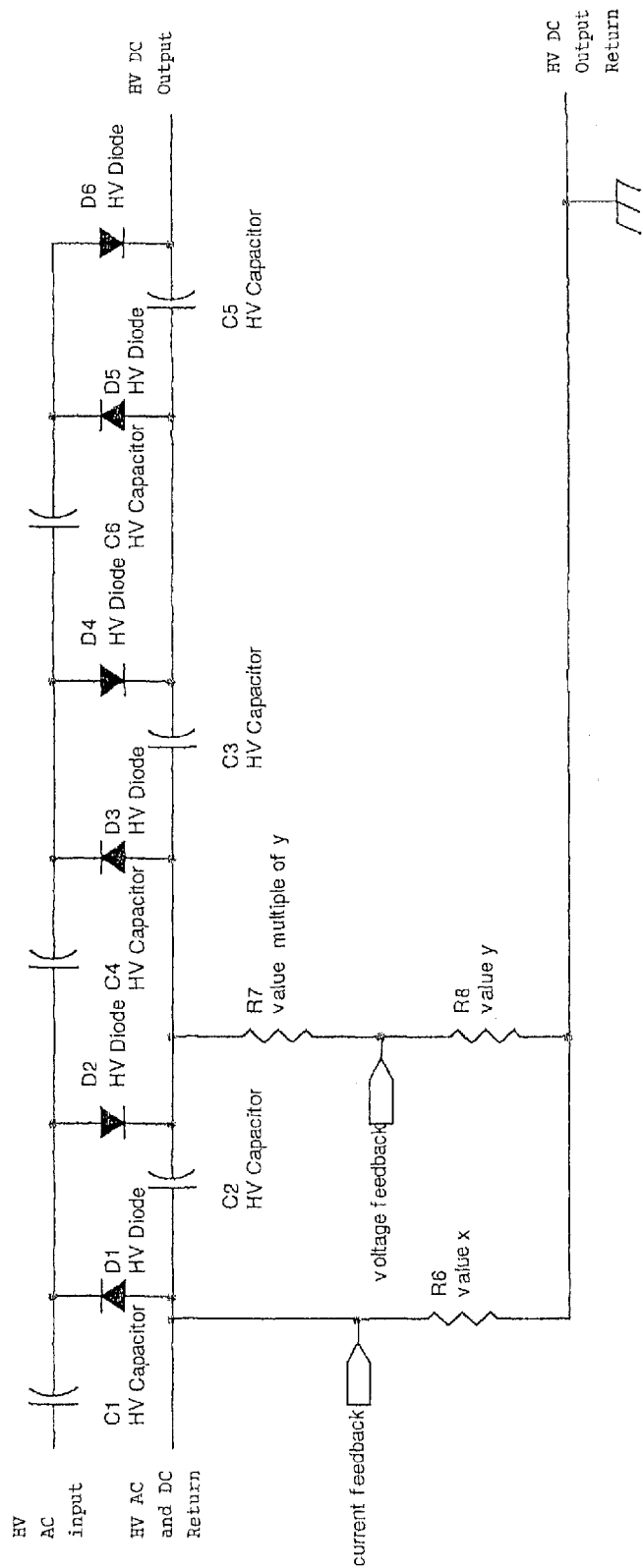
FIG. 5 depicts a high voltage multiplier with an earlier voltage sensing divider, constructed in accordance with the present invention.

FIG. 5 depicts a high voltage multiplier with an earlier voltage sensing divider, constructed in accordance with the present invention.

The voltage at the first of three stages of the multiplier is essentially one third that of the full output, since each multiplier stage doubles the peak AC output voltage of the high voltage output transformer employed to feed the multiplier's input. So, at this stage, for the example of a 24 kV output power supply, the voltage is 8 kV.

To generate the 48 uA desired output slope, again employing Ohm's Law, a total resistance of 8 kV/48 uA=166.67M Ohms is needed. The power lost by this resistance value is 8 kV*48 uA=384 mW, which is one third that of the circuit of FIG. 3. Thus, a savings of 768 mW is obtained at a slight loss of output voltage regulation accuracy.

The voltage output accuracy is slightly negatively affected by this regulation technique, due to the slight drop in voltage by each successive multiplier stage after the point of regulation sensing. This drop may be a few hundred volts of the 24 kV example, due to the forward drop voltage and losses of the rectifier diodes, and by the slight equivalent series resistance of the multiplier capacitors employed.

If this drop in output over the VM range presents a problem for the device, a novel technique may be employed to correct it. The output voltage drop of the uncorrected multiplier stages will be largely directly proportional to the output current level, since the loss elements mostly represent those of a resistive nature. Remember that the VM mode is controlled by an error amplifier, represented by VM EA in FIG. 2. The output voltage is locked directly to the voltage reference input to the non-inverting input of the VM EA. The reference voltage level is typically a few volts, to make use of the myriad of available integrated circuits for this purpose. For this example, a reference voltage of one volt is used. Since the output voltage is 24,000 volts, this means that for the voltage feedback signal must also be one volt, when VM EA and power supply is in equilibrium state. The drop in output will be near zero at no output current, and may be a few hundred volts at full output current. Thus, to correct an output drop of, say, 500V at full load, the reference voltage must be increased (when at full load) by 500*1/24000 volts, or 20.833 mV. However, it is not desirable to increase the reference voltage at no load condition.

Remedying the output voltage drop is done by utilizing the current feedback voltage signal to create a correction voltage. The current feedback signal, which may be in the range of a volt or more, is reduced with a resistive voltage divider network, and adding the correction voltage to the reference voltage. An inverting amplifier device, such an inverting op amp stage, may need to be employed if the correction signal is of the opposite polarity needed. This polarity issue will be ignored for this example, shown in FIG. 6.

Figure 6:
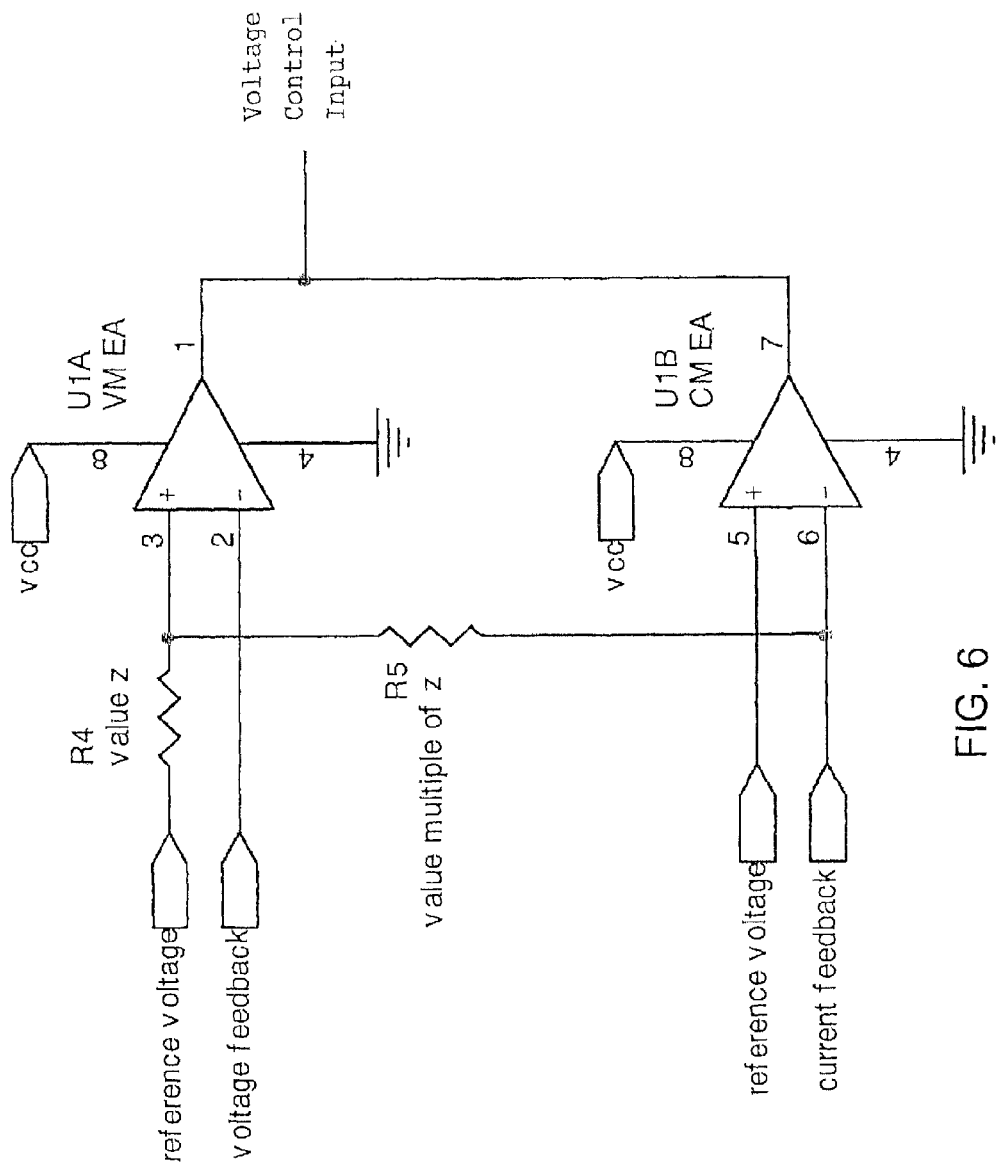
FIG. 6 depicts an output voltage drop correction circuit, constructed in accordance with the present invention.

FIG. 6 depicts an output voltage drop correction circuit, constructed in accordance with the present invention. If, for example, the feedback voltage is assumed to be two volts for full output current, and the correction voltage needed is as above, 20.833 mV, a voltage divider network with values to fit these figures can then be created. For this example, using a fairly low value of R4, such as 1 k ohm is used. A voltage of 20.833 mV is developed across the 1 k resistor; so the voltage at the non-inverting input will be approximately 1.0208V when full output current is drawn from the power supply. The reference voltage is constant at one volt, and the current feedback voltage will be 2V. So, the current through the 1 k resistor caused by the correction voltage of 20.833 mV will be 20.833 uV. This current must be supplied by R5, so its value must be (2V−1V)/20.833 uA=48 k ohms. With this network in place, the output drop will be corrected to nearly equal values from no load to full load on the power supply over the VM range, and is not affected in the CM range.

In summary, the novel developments of controlled CM current slope output, the tapped multiplier feedback network, and the subsequent output voltage correction network, have yielded a power supply with the desired VM and CM output characteristics that is significantly less expensive to construct and more efficient than one utilizing conventional construction.

The invention shown in the drawings and described in detail herein disclose arrangements of elements of particular construction and configuration for illustrating preferred embodiments of structure and method of operation of the present invention. It is to be understood however, that elements of different construction and configuration and other arrangements thereof, other than those illustrated and described may be employed for providing regulation control in high voltage power supplies by innovative component placement and selection techniques, in accordance with the spirit of this invention, and such changes, alternations and modifications as would occur to those skilled in the art are considered to be within the scope of this invention as broadly defined in the appended claims.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

We claim:

1. A high-voltage power supply comprising:
    a voltage multiplier having multiple stages;
    a voltage divider network; and
    wherein the voltage divider network is electrically connected to the voltage multiplier only between two stages of the voltage multiplier so as to provide a voltage to the voltage divider network that is lower than and proportional to an output voltage of the voltage multiplier for voltage feedback control of the high-voltage power supply;
    wherein the voltage divider network is not directly electrically connected to the voltage multiplier other than between the two stages of the voltage multiplier; and
    wherein the voltage divider network is not indirectly electrically connected to the voltage multiplier other than between the two stages of the voltage multiplier.

2. The high-voltage power supply according to claim 1, wherein the voltage divider network is connected to a first intermediate stage of the voltage multiplier.

3. The high-voltage power supply according to claim 1, wherein the voltage divider network is connected to a second one of the stages of the voltage multiplier.

4. The high-voltage power supply according to claim 1, wherein the voltage multiplier is an (n) stage voltage multiplier and the voltage divider network is connected to an (n−1) intermediate stage of the (n) stage voltage multiplier.

5. The high-voltage power supply according to claim 1, wherein a current feedback signal is reduced with a resistive voltage divider network.

6. A method of regulating output current in a high-voltage power supply, the method comprising:
    increasing a voltage with a multi-stage voltage multiplier;
    dividing a voltage of the voltage multiplier using a voltage divider network; and
    wherein the voltage divider network is electrically connected to the voltage multiplier only between two stages of the voltage multiplier so as to provide a voltage to the voltage divider network that is lower than and proportional to an output voltage of the voltage multiplier for voltage feedback control of the high-voltage power supply;
    wherein the voltage divider network is not directly electrically connected to the voltage multiplier other than between the two stages of the voltage multiplier; and
    wherein the voltage divider network is not indirectly electrically connected to the voltage multiplier other than between the two stages of the voltage multiplier.

7. The method according to claim 6, wherein voltage divider is connected to a first intermediate stage of the voltage multiplier.

8. The method according to claim 6, wherein the voltage divider is connected to a second one of the stages of the voltage divider.

9. The method according to claim 6, wherein voltage multiplier is an (n) stage voltage multiplier and the voltage divider network is connected to an (n−1) intermediate stage of the (n) stage voltage multiplier.

10. The method according to claim 6, further comprising providing a voltage feedback signal.

* * * * *